United States Patent [19]

Yoshida et al.

[11] Patent Number: 4,604,730
[45] Date of Patent: Aug. 5, 1986

[54] SEMICONDUCTOR MEMORY DEVICE

[75] Inventors: Masanobu Yoshida, Kawaguchi; Kiyoshi Itano, Kawasaki, both of Japan

[73] Assignee: Fujitsu Limited, Kawasaki, Japan

[21] Appl. No.: 578,000

[22] Filed: Feb. 8, 1984

[30] Foreign Application Priority Data

Feb. 8, 1983 [JP] Japan ............................... 58-18027

[51] Int. Cl.$^4$ .............................................. G11C 7/00
[52] U.S. Cl. ................................................... 365/200
[58] Field of Search ......................................... 365/200

[56] References Cited

U.S. PATENT DOCUMENTS 4,460,998 7/1984 Yamada et al. ...................... 365/200
4,471,472 9/1984 Young ................................. 365/200

OTHER PUBLICATIONS

IEEE International Solid-State Circuits Conference, "Redundancy Techniques for Fast Static RAMs", Kokkonen et al., ISSCC 81, 2/18/81, pp. 80-81.
IEEE International Solid-State Circuits Conference, "A 128K EPROM with Redundancy", Spaw et al., ISSCC 82, 2/11/82, pp. 112-113.

Primary Examiner—James W. Moffitt
Attorney, Agent, or Firm—Staas & Halsey

[57] ABSTRACT

A semiconductor memory device includes a plurality of memory cell blocks corresponding to output terminals, and a redundancy memory cell block for replacing a faulty memory cell block among the memory cell blocks, the redundancy memory cell block having a first specific area for storing a first predetermined data of electronic signatures. Each of the memory cell blocks having a second specific area for storing a second predetermined data equal to a divided one of the first predetermined data in a one to one correspondence. The semiconductor memory device further includes a circuit for selectively reading, when one of the memory cell blocks is replaced by the redundancy memory cell block, a divided one of the first predetermined data corresponding to the second predetermined data stored in the memory cell block to be replaced by the redundancy memory cell block. The second predetermined data can be correctly read out even when a faulty memory cell block is replaced with the redundancy memory cell block.

11 Claims, 14 Drawing Figures

|  | | OUTPUT | | | | | | | |
|---|---|---|---|---|---|---|---|---|---|
|  | | MSB | | | | | | | LSB |
|  | | Q8* | Q7 | Q6 | Q5 | Q4 | Q3 | Q2 | Q1 |
| ES1 (M.C.) | B0 | d80 | d70 | d60 | d50 | d40 | d30 | d20 | d10 |
| ES2 (A.C.) | B1 | d81 | d71 | d61 | d51 | d41 | d31 | d21 | d11 |
| ES3 | B2 | | | | | | | | |
| ES4 | B3 | | | | | | | | |
| ⋮ | B4 | | | | | | | | |
| | B5 | | | | | | | | |
| | B6 | | | | | | | | |
| | B7 | | | | | | | | |
| | B8 | | | | | | | | |
| | B9 | | | | | | | | |
| | B10 | | | | | | | | |
| | B11 | | | | | | | | |
| | B12 | | | | | | | | |
| | B13 | | | | | | | | |
| | B14 | | | | | | | | |
| ES16 | B15 | d816 | d716 | d616 | d516 | d416 | d316 | d216 | d116 |
| | | D8 | D7 | D6 | D5 | D4 | D3 | D2 | D1 |

FOR EACH MANUFACTURER

Fig. 5

| JEDEC | Q8 | Q7 | Q6 | Q5 | Q4 | Q3 | Q2 | Q1 |
|---|---|---|---|---|---|---|---|---|
| 1  AMD | 0 | 0 | 0 | 0 | 0 | 0 | 0 | 1 |
| 2  AMI | 0 | 0 | 0 | 0 | 0 | 0 | 1 | 0 |
| 3  FAIRCHILD | 1 | 0 | 0 | 0 | 0 | 0 | 1 | 1 |
| 4  FUJITSU | 0 | 0 | 0 | 0 | 0 | 1 | 0 | 0 |
| 5  GTE | 1 | 0 | 0 | 0 | 0 | 1 | 0 | 1 |
| 6  HARRIS | 1 | 0 | 0 | 0 | 0 | 1 | 1 | 0 |
| 7  HITACHI | 0 | 0 | 0 | 0 | 0 | 1 | 1 | 1 |
| 8  INNOS | 0 | 0 | 0 | 0 | 1 | 0 | 0 | 0 |
| 9  INTEL | 1 | 0 | 0 | 0 | 1 | 0 | 0 | 1 |
| 10 ITT | 1 | 0 | 0 | 0 | 1 | 0 | 1 | 0 |
| 11 INTERSIL | 0 | 0 | 0 | 0 | 1 | 0 | 1 | 1 |
| 12 MONOLITHIC MEMORIES | 1 | 0 | 0 | 0 | 1 | 1 | 0 | 0 |
| 13 MOSTEK | 0 | 0 | 0 | 0 | 1 | 1 | 0 | 1 |
| 14 MOTOROLA | 0 | 0 | 0 | 0 | 1 | 1 | 1 | 0 |
| 15 NATIONAL | 1 | 0 | 0 | 0 | 1 | 1 | 1 | 1 |
| 16 NEC | 0 | 0 | 0 | 1 | 0 | 0 | 0 | 0 |
| 17 RCA | 1 | 0 | 0 | 1 | 0 | 0 | 0 | 1 |
| 18 RAYTHEON | 1 | 0 | 0 | 1 | 0 | 0 | 1 | 0 |
| 19 ROCKWELL | 0 | 0 | 0 | 1 | 0 | 0 | 1 | 1 |
| 20 SEEQ | 1 | 0 | 0 | 1 | 0 | 1 | 0 | 0 |
| 21 SIGNETICS | 0 | 0 | 0 | 1 | 0 | 1 | 0 | 1 |
| 22 SYNERTEK | 0 | 0 | 0 | 1 | 0 | 1 | 1 | 0 |
| 23 TEXAS INSTRUMENTS | 1 | 0 | 0 | 1 | 0 | 1 | 1 | 1 |
| 24 TOSHIBA | 1 | 0 | 0 | 1 | 1 | 0 | 0 | 0 |
| 25 XICOR | 0 | 0 | 0 | 1 | 1 | 0 | 0 | 1 |
| 26 ZILOG | 0 | 0 | 0 | 1 | 1 | 0 | 1 | 0 |

Fig. 6

|     | C0 | C1 | C2 | C3 | C4 | C5 | C6 | C7 |
|-----|----|----|----|----|----|----|----|----|
| a4  | 0  | 1  | 0  | 1  | 0  | 1  | 0  | 1  |
| a5  | 0  | 0  | 1  | 1  | 0  | 0  | 1  | 1  |
| a6  | 0  | 0  | 0  | 0  | 1  | 1  | 1  | 1  |

SEMICONDUCTOR MEMORY DEVICE

BACKGROUND OF THE INVENTION

1. Field of the Invention

The present invention relates to a programmable read only semiconductor memory device (PROM), and more particularly, to a reading circuit for reading an electronic signature which is a type of read only memory (ROM) data relating to an attribute of the PROM.

2. Description of the Prior Art

Recently, the JEDEC (Joint Electron Device Engineering Council), which is a subordinate facility of the U.S. Electronic Industrial Association (EIA), proposed the use of so-called electronic signatures. That is, by previously writing the electronic signatures as one kind of ROM data such as manufacturers' codes or programming algorithm numbers into an erasable and programmable read only semiconductor memory device (EPROM), during its manufacture, these data can be read by applying a specific signal to a specific terminal of the EPROM. The contents of the data construction of the electronic signatures such as the manufacturers' codes are described later in more detail with reference to FIGS. 4 and 5.

Generally, in an EPROM, in order to improve the production yield of chips, a redundancy structure is employed so that a redundant circuit can replace a faulty circuit. Such redundancy techniques are disclosed in, for example, ISSCC 81/Wednesday, Feb. 18, 1981/BALL ROOMS A-B/3:15 P.M., pp 80-81, and ISSCC 82/Thursday, Feb. 11, 1982/CONTINENTAL BALL ROOMS 1-4/10:45 A.M., pp 112-113.

In an EPROM having a redundancy structure, it is necessary to correctly read out the contents of the data of the electronic signature corresponding to the replaced circuit portion when the redundancy circuit is used.

SUMMARY OF THE INVENTION

An object of the present invention is to provide a semiconductor memory device having a redundancy structure, from which an electronic signature can correctly be read out whenever a redundancy circuit is replaced by any circuit portion in the semiconductor memory device.

To attain the above object, there is provided, according to the present invention, a semiconductor memory device including a plurality of output terminals for outputting a plurality of output bit data, respectively, a plurality of memory cell blocks corresponding to the output terminals, and a redundancy memory cell block able to replace a faulty memory cell block among the memory cell blocks. The redundancy memory cell block has a first specific area for storing a first predetermined data having a plurality of bits. Each of the memory cell blocks has a second specific area for storing a second predetermined data. The second predetermined data is equal to a divided one of the first predetermined data in a one to one correspondence. The semiconductor memory device further includes a means for selectively reading, when one of the memory cell blocks is replaced by the redundancy memory cell block, a divided one of the first predetermined data corresponding to the second predetermined data stored in the memory cell block to be replaced by the redundancy memory cell block.

BRIEF DESCRIPTION OF THE DRAWINGS

The above object and the features of the present invention will become more apparent from the following description of the preferred embodiments with reference to the accompanying drawings, wherein.

DESCRIPTION OF THE PREFERRED EMBODIMENTS

Embodiments of the present invention will now be described with reference to the drawings.

Figure 1:
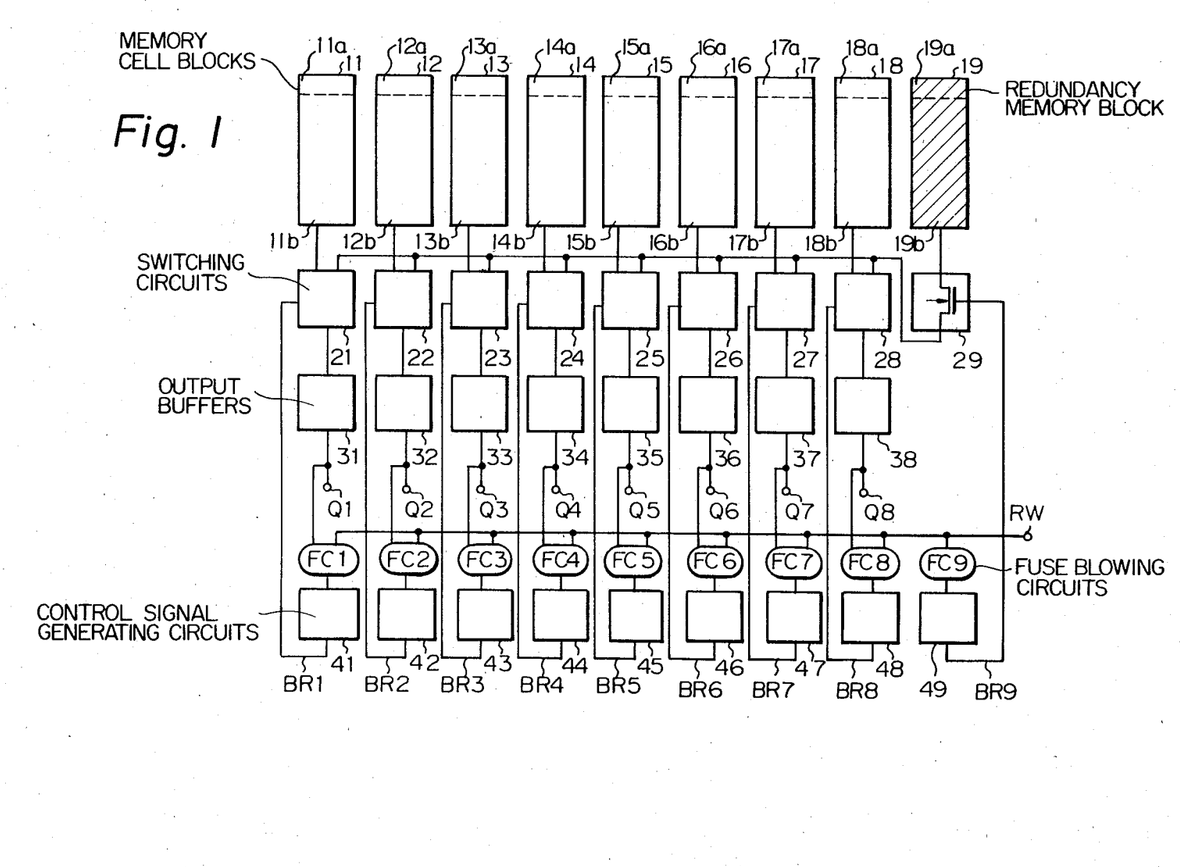
FIG. 1 is a block circuit diagram of a general construction of an EPROM according to an embodiment of the present invention.

FIG. 1 is a circuit diagram of a general construction 8-bit output EPROM having a redundancy memory cell block, according to an embodiment of the present invention. In the EPROM shown in FIG. 1, among memory cell blocks 11 through 19, the memory cell blocks 11 through 18 corresponding to 8 bits of output terminals Q1 through Q8 are connected through switching circuits 21 through 28 to output buffers 31 through 38, respectively. The memory cell block 19 is a redundancy memory cell block which is connected through a switching circuit 29 to the switching circuits 21 through 28, so as to replace a faulty memory cell block corresponding to one of the output terminals Q1 through Q8. The switching of each of the switching circuits 21 through 29 is controlled by a control signal BRi, where i=1, 2, ..., or 9, from control signal generating circuits 41 through 49. In each of the control signal generating circuits 41 through 49, a control signal BRi is output in response to a conductive or nonconductive state of a fuse provided therein (not shown in FIG. 1 but described in detail later with reference to FIG. 9.) In order to replace one faulty memory cell block among the memory cell blocks 11 through 18 with the redundancy memory cell block 19, a fuse in the corresponding control signal generating circuit is blown by one of the fuse-blowing signals FC1 through FC8 corresponding to the memory cell block to be replaced. Also, the fuse in the control signal generating circuit 49 is blown by a fuse-blowing signal FC9 corresponding to the redundancy memory cell block 19. The fuse-blowing signals FC1 through FC8 are generated in response to a replacing signal RW and replaced block selecting signals applied to the output terminals Q1 through Q8, respectively.

The memory cell blocks 11 through 19 have specific areas 11a, 12a, 13a, . . . , and 19a, respectively, for storing electronic signatures also referred to as silicon signatures. These specific areas include read only memories. The remaining areas 11b, 12b, . . . , and 19b of the memory cell blocks 11 through 19, respectively, are programmable and erasable read only memory cells.

By replacing one faulty memory cell block with the redundancy memory cell block 19, the correct electronic signature with respect to the faulty memory cell block can be read out from the specific area 19a in the redundancy memory cell block 19, as later described in detail.

Figure 2:
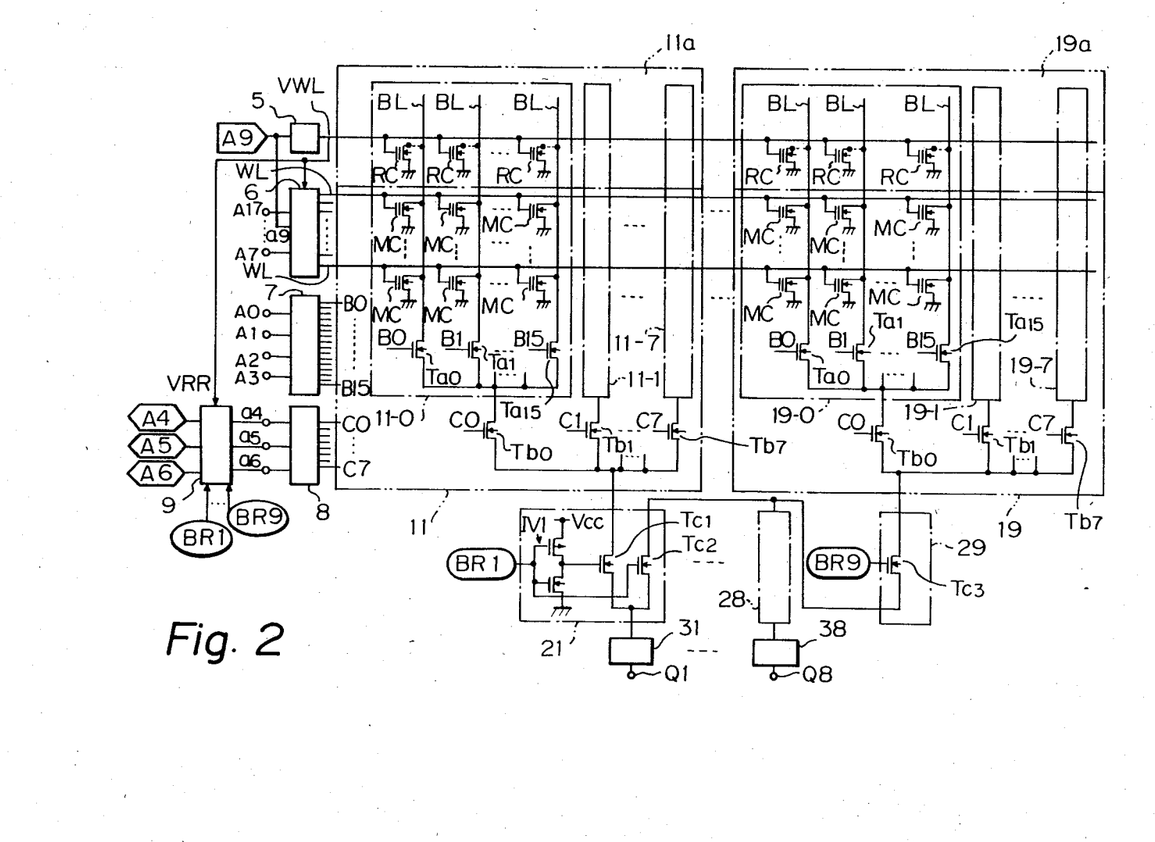
FIG. 2 is a circuit diagram of a memory cell block, a redundancy memory cell block, and switching circuits in the EPROM shown in FIG. 1.

In FIG. 2, the construction of the memory cell block 11, the redundancy memory cell block 19, and the switching circuits 21 and 29 in the EPROM shown in FIG. 1 are illustrated in more detail. In the memory cell block 11, a plurality of word lines WL and a plurality of bit lines BL are provided orthogonally. At each intersection of a word line WL and a bit line BL, an erasable and programmable read only memory cell MC is provided. In the specific area 11a, there is provided a virtual word line VWL extending in parallel to the word lines. At the intersection of the virtual word line VWL and each of the bit lines BL, a read-only memory cell RC is connected. The read-only memory cells RC are adapted to store data of the electronic signatures by connecting or not connecting them to respective bit lines BL. An example of the electronic signatures will be described later with reference to FIGS. 4 and 5. The virtual word line VWL is connected to a signal detecting circuit 5 which detects a virtual word line selecting signal applied to an address input terminal $A_9$ and then drives the virtual word line VWL for reading the electronic signatures from the read only memory cells RC. Each word line WL is connected to a row decoder circuit 6. When the signal on the virtual word line VWL becomes "H", a row decoder 6 is controlled by the signal so that all the word lines become "L".

The memory cell block 11 is divided into eight sub-blocks 11-0, 11-1, . . . , and 11-7 each including sixteen bit lines BL. All of the sixteen bit lines BL in the first sub-block 11-0 are connected through bit-line selecting transistors $T_{a0}, T_{a1}, \ldots$, and $T_{a15}$, respectively, through a sub-block-selecting transistor $T_{b0}$, and through a memory-cell block selecting transistor $T_{c1}$ in the switching circuit 21, to the output buffer 31. Similarly, all of the sixteen bit lines in each of the other sub-blocks 11-1, 11-2, . . . , and 11-7 are connected through similar bit-line selecting transistors (not shown), a similar sub-block selecting transistor (not shown), and through the memory-cell block selecting transistor $T_{c1}$ in the switching circuit 21, to the same output buffer 31.

The switching circuit 21 further includes an inverter IV1 having an input for receiving the control signal BR1 from the control signal generating circuit 41, and having an output connected to the gate of the transistor $T_{c1}$. The switching circuit 21 still further includes a redundancy-block selecting transistor $T_{c2}$ having a gate connected to the input of the inverter IV1. The sources of the transistors $T_{c1}$ and $T_{c2}$ are connected to the output buffer 31.

Each of the other memory cell blocks 12, 13, . . . , and 19 has the same circuit configuration as that of the memory cell block 11.

Each of the switching circuits 22, 23, . . . , and 28 corresponding to the memory cell blocks 12, 13, . . . , and 18, respectively has the same circuit configuration as that of the switching circuit 21. However, the switching circuit corresponding to the redundancy memory cell block 19 has a single switching transistor $T_{c3}$ having a gate electrode adapted to receive the control signal BR9. The sources of the sub-block selecting transistors $T_{b0}, T_{b1}, \ldots$, and $T_{b7}$ in the redundancy memory cell block 19 are commonly connected through the switching transistor $T_{c3}$ to the drains of the redundancy block selecting transistors $T_{c2}$ in all of the switching circuits 21 through 28.

In each of the sub-blocks in all of the memory cell blocks 11 through 19, the gate electrodes of the bit-line selecting transistors $T_{a0}, T_{a1}, \ldots$, and $T_{a15}$ are adapted to receive bit-line selecting signals B0, B1, . . . , and B15, respectively. The bit-line selecting signals B0, B1, . . . , and B15 are supplied from a first column decoder circuit 7 which decodes low-order column address input signals A0, A1, A2, and A3 so as to render one of the bit-line selecting signals B0, B1, . . . , and B15 to a high potential level "H".

In each of the memory cell blocks 11 through 19, the gate electrodes of the sub-block selecting transistors $T_{b0}, T_{b1}, \ldots$, and $T_{b7}$ are adapted to receive sub-block selecting signals C0, C1, . . . , and C7, respectively. The sub-block selecting signals C0, C1, . . . , and C7 are supplied from a second column decoder circuit 8 which decodes high-order column address signals a4, a5, and a6 so as to render one of the sub-block selecting signals C0, C1, . . . , and C7 to the high potential level "H". Thus, by specifying the column address signals Ao through A3 and a4 through a6, one of the eight sub-blocks in each memory-cell block is selected, and one of the sixteen bit lines BL in each of the selected sub-blocks is selected.

The virtual word line VWL is also connected to the row decoder circuit 6 and to an address signal generating circuit 9. When the virtual word line VWL is selected, a reference voltage VRR is applied to the row decoder circuit 6 to inhibit its operation, and to the address signal generating circuit 9 to generate a fixed set of address signals a4, a5, and a6 in response to the control signals BR1 throgh BR9.

Figure 3:
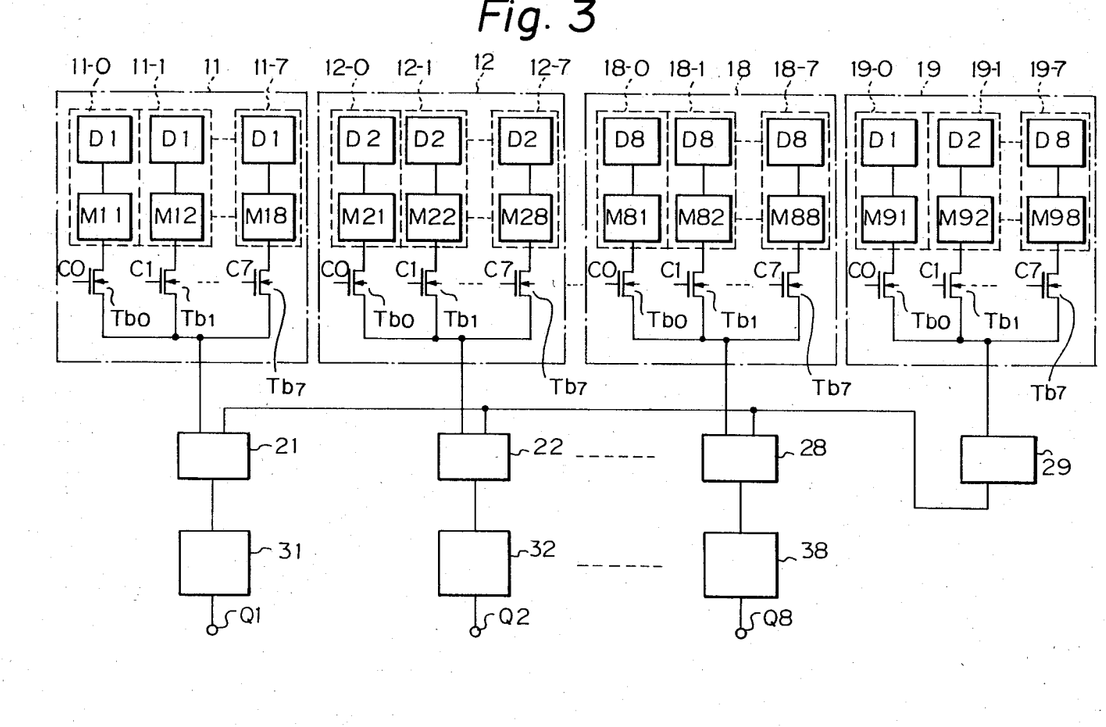
FIG. 3 is a block circuit diagram of the EPROM shown in FIG. 2, having electronic signature data.

In this embodiment, all of the read only memory cells RC in one memory cell block, except for the redundancy memory cell block 19, store the same data, as illustrated in FIG. 3. That is, in FIG. 3, the same reference symbols used in FIGS. 1 and 2 represent the same parts. Reference symbols D1, D2, . . . , and D8 represent the data of the electronic signatures stored in the memory cell blocks 11 through 19 shown in FIG. 2. Reference symbols M11, M12, . . . , M18, M21, M22, . . . , M28, . . . , M91, M92, . . . , and M98 represent data stored in the memory cells MC of the respective sub-blocks 11-0, 11-1, . . . , 11-7, 12-0, . . . , 12-7, 19-0, . . . , and 19-7 shown in FIG. 2. As shown in FIG. 3, all of the sub-blocks in the memory cell block 11 store the same data D1. Also, all of the sub-blocks in the memory cell block 12 store the same data D2. Similarly, all of the sub-blocks in each of the memory cell blocks 13 through 18 store the same data D3, D4, . . . , or D8, respectively. On the contrary, in the redundancy memory cell block 19, the sub-blocks 19-0, 19-1, . . . , and 19-7, respectively, store the data D1, D2, . . . , and D8 corresponding to the data stored in the memory cell blocks 11 through 18, respectively.

Operation of the circuit shown in FIG. 2 will now be described. When the electronic signature is to be read, and when one of the memory cell blocks 11 through 18 is malfunctioning, the virtual word line VWL is selected by applying an address input signal (also expressed by the reference symbol A9) of 12 V to the signal detecting circuit, and all of the word lines WL are not selected because the row decoder circuit 6 is inhibited by the selected virtual word line VWL. The selected virtual word line VWL supplies the reference voltage VRR to the address signal generating circuit 9. Thus, the redundancy memory cell block 19 is used in place of the malfunctioning or faulty memory cell block. Assuming that the memory cell block 11 is malfunctioning, the control signals BR1 and BR9 are then made to be the "H" level. The "H" level of the control signal BR1 is inverted by the inverter IV1 so that the memory-cell block selecting transistor $T_{c1}$ is turned off. The "H" level of the control signal BR1 is directly applied to the gate of the redundancy-block selecting transistor $T_{c2}$, so that it turns on. Also, the transfer gate transistor $T_{c3}$ in the switching circuit 29 is turned on by the control signal BR9. When the data of the electronic signature stored in the malfunctioning memory cell block 11 is to be read, it is sufficient to fix the sub-block selecting signal C0 at the "H" level, regardless of the address input signals A4 through A6. The fixing operation of the sub-block selecting signal C0 is carried out by means of the address signal generating circuit 9, as described later in detail. Thus, in place of the data D1 stored in the malfunctioning memory cell block 11, the data D1 stored in the first sub-block 19-0 of the redundancy memory cell block 19 is transferred through the transistors $T_{c3}$ and $T_{c2}$ to the output buffer 31.

When the EPROM shown in FIG. 2 is used as a usual EPROM without reading the electronic signature and without replacing a faulty memory-cell block with the redundancy memory cell block 19, all of the control signals BR1 through BR9 are set at the low potential level "L", and the address input signal A9, i.e., the virtual word line selecting signal, at the address input terminal A9 is not raised to the high potential of 12 V. As a result, the bit line selecting transistors $T_{c1}$ in all of the switching circuits 21 through 28 are conductive, and the transfer gate transistor $T_{c3}$ in the switching circuit 29 is nonconductive. Also, the row decoder circuit 6 decodes row address signals A7, A8, . . . , and A17 so as to render one of the word lines WL a high potential level "H", and the virtual word line VWL is not selected. Accordingly, the erasable and programmable memory cells MC are selected to read data therefrom, to write data therein, or to erase data in the memory cells MC.

When a faulty memory cell block, for example, the memory cell block 11 is replaced by the redundancy memory cell block 19 during the accessing of the memory cells MC, the replacing operation is the same as that used when the electronic signature is to be read. In this case, the virtual word line VWL is not selected.

Replacement of any other faulty memory cell block with the redundancy memory cell block 19 can be carried out by selecting the corresponding control signal BRi (i=2, 3, . . . , or 8) and the control signal BR9 to be at the high potential level "H".

Figure 4:
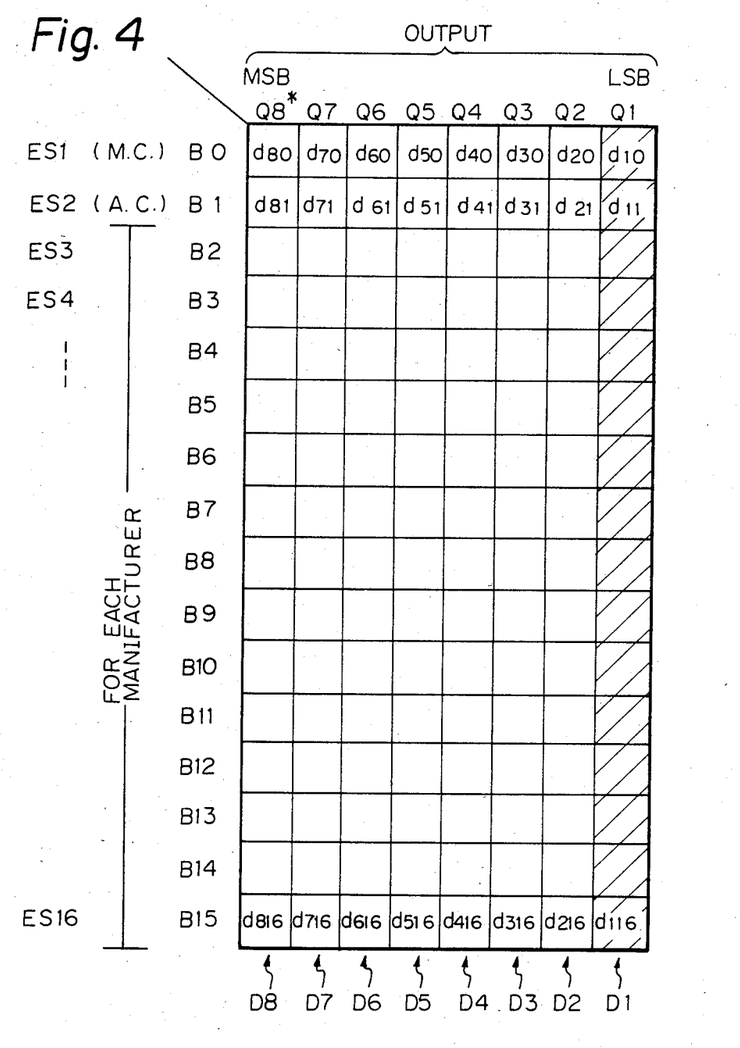
FIG. 4 is a table of a format of the electronic signatures proposed by JEDEC.

FIG. 4 is a table showing a format of the electronic signatures proposed by JEDEC. As shown in FIG. 4, sixteen electronic signatures ES1, ES2, . . . , and ES16 are stored in the read only memory cells RC of the EPROM shown in FIG. 2. Each of the silicon signatures, i.e., electronic signatures, comprises 8-bit data. Each bit in one electronic signature is output from one of the eight output terminals Q1 through Q8. The first electronic signature ES1 is a manufacturers' code M.C. comprising 8-bit data $d_{10}, d_{20}, \ldots,$ and $d_{80}$. The second electronic signature ES2 is a programming algorithm code A.C. comprising 8-bit data $d_{11}, d_{21}, \ldots,$ and $d_{81}$. The third electronic signature ES3 through the sixteenth electronic signature ES16 are defined separately by each manufacturer. In the circuit shown in FIG. 2, the 8-bit data $d_{10}, d_{20} \ldots,$ and $d_{80}$ of the first electronic signature are stored in the memory cell blocks 11 through 18, respectively. More precisely, the least significant bit data $d_{10}$ is stored in the first read only memory cell RC associated with the first bit line BL which is selected by the bit-line selecting signal B0, in each sub-block of the first memory cell block 11. The second bit data $d_{20}$ in the first electronic signature is stored in the first read only memory cell RC selected by the bit-line selecting signal B0 in each sub-block of the second memory cell block 12. Similarly, the remaining bit data $d_{30}, d_{40}, \ldots,$ and $d_{80}$ are stored in the first read only memory cells RC selected by the bit-line selecting signal B0, in respective memory cell blocks 13 through 18, respectively.

The 8-bit data $d_{11}, d_{21}, \ldots,$ and $d_{81}$ of the second electronic signature ES2 are stored in the read only memory cells RC selected by the bit-line selecting signal B1, in the memory cell blocks 11 through 18, respectively.

Thus, the 8-bit data of each electronic signature are stored in respective read only memory cells in the respective memory cell blocks 11 through 18. Accordingly, each of the sub-blocks 11-0 through 11-7 in the first memory cell block 11 stores the data D1 comprising sixteen bits of data $d_{10}, d_{11}, \ldots,$ and $d_{116}$, as illustrated in FIG. 4 by slashed lines. Each of the sub-blocks 12-0 through 12-7 stores the data D2 comprising sixteen bits of data $d_{20}, d_{21}, \ldots,$ and $d_{215}$. Similarly, each of the remaining memory cell blocks 13 through 18 stores eight sets of the same sixteen-bit data D3, D4, . . . or D8.

In the table shown in FIG. 4, the most significant bit data $d_{80}, d_{81}, \ldots,$ or $d_{816}$, which is output from the output terminal Q8 (marked with an asterisk, ) is an odd parity bit for each electronic signature.

Figure 5:
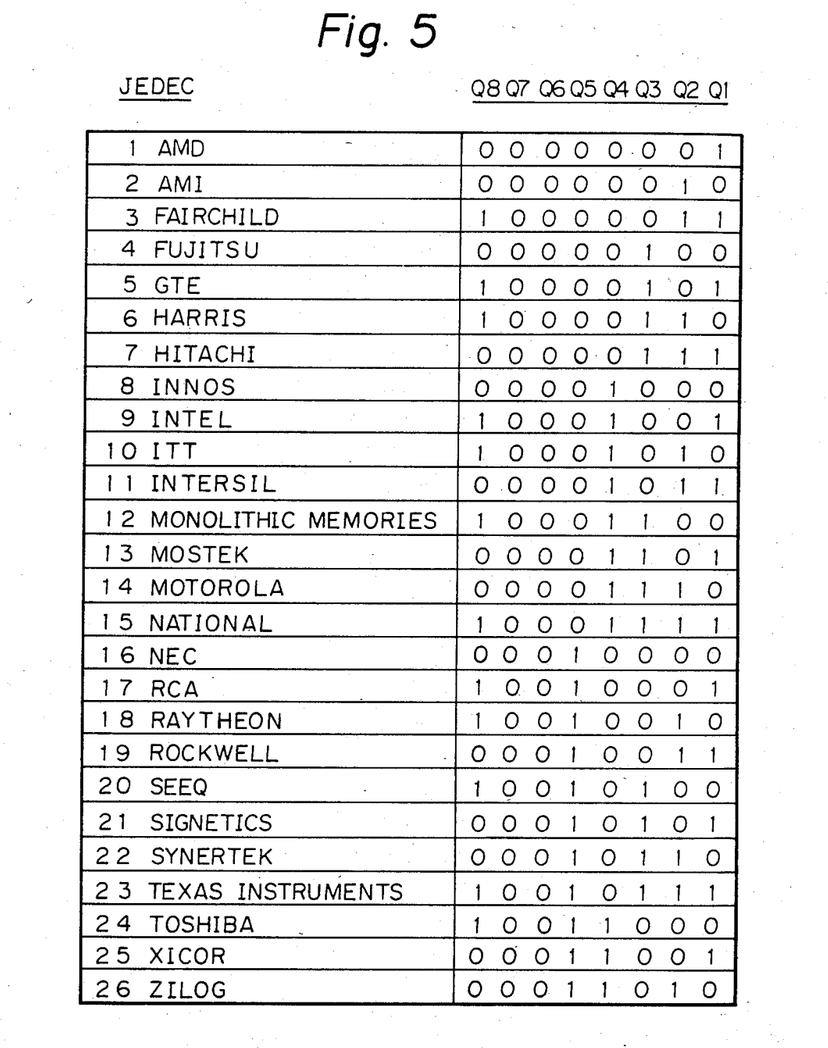
FIG. 5 is a table of various examples of the manufacturers' codes.

FIG. 5 is a table showing various examples of the first electronic signature ES1, i.e., manufacturers' codes. In FIG. 5, a manufacturers' code, for example, AMD, comprises of 8-bit data 000 000 01. Each bit is output from one of the output terminals Q1 through Q8. These manufacturers' codes are stored in the read only memory cells RC of respective devices, to enable a user to identify the devices.

Figure 6:
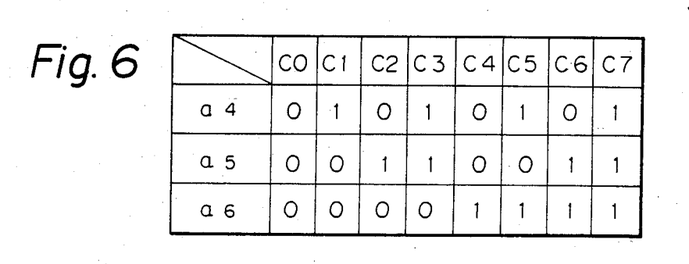
FIG. 6 is a table of the relationship between address signals and selected sub-blocks.

FIG. 6 is a table showing the relationship between the high order column address signals a4, a5, and a6, and the selected sub-blocks. In FIG. 6, when the column address signals a4, a5, and a6 are 0, 0, and 0, respectively, the sub-block selecting signal C0 is at an "H" level so that the corresponding sub-blocks 11-0, 12-0, . . . , and 19-0 (FIG. 2) are selected. In this case, the memory cell block 11 can be replaced by the redundancy memory cell block 19. Also, when the column address signals a4, a5, and a6 are 1, 0, 0, respectively, the sub-block selecting signal C1 is at an "H" level so that the corresponding sub-blocks 11-1, 12-1, . . . , and 19-1 are selected. In this case, the memory cell block 12 can be replaced by the redundancy memory cell block 19. Other combinations of the column address signals a4, a5, and a6 result in corresponding sub-block selecting signals C2, C3, . . . , and C7 being at an "H" level. By fixing the combination of the column address signals a4, a5, and a6 to a desired pattern, a desired sub-block selecting signal is selected. As a result, a replacing operation is carried out.

Figure 7A:
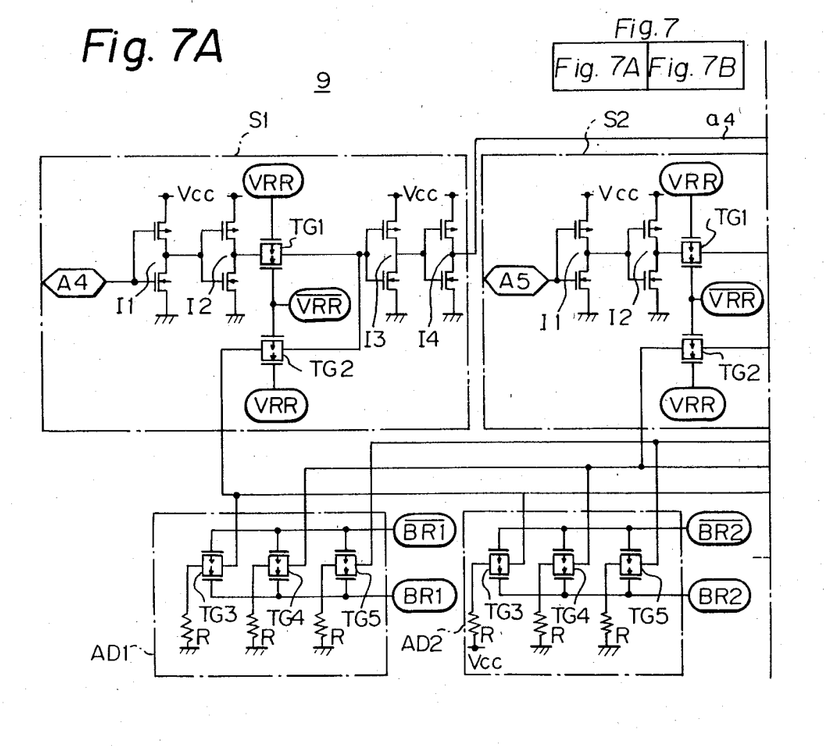
FIGS. 7A and 7B are a circuit diagram of an address signal generating circuit in the EPROM shown in FIG. 2 in more detail.
Figure 7B:
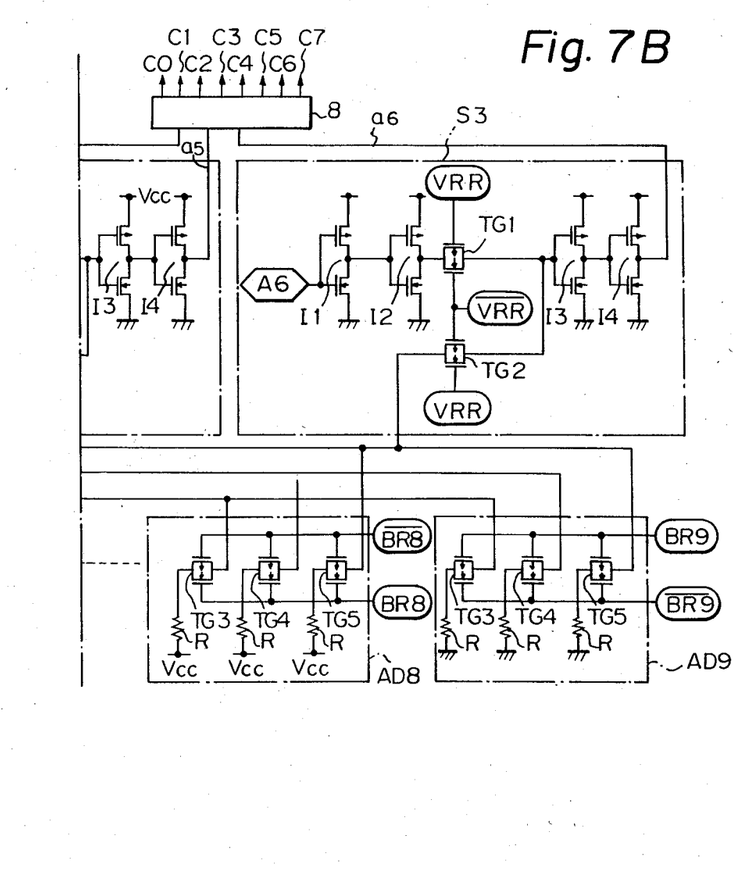

FIG. 7 is a circuit diagram of the address signal generating circuit 9 in more detail. In FIG. 7, the address signal generating circuit 9 comprises three address signal selecting circuits S1, S2, and S3, and nine address signal determining circuits AD1, AD2, . . . , and AD9. Each of the address signal selecting circuits S1, S2, and S3 includes two inverters I1 and I2 comprising complementary metal oxide semiconductor (CMOS) transistors, two transfer gates TG1 and TG2, and two CMOS inverters I3 and I4. The inverters I1 through I4 function as waveform shaping circuits. Each of the transfer gates TG1 and TG2 comprises a P channel metal oxide semiconductor (MOS) transistor and an N channel MOS transistor connected in parallel. Each of the address signal determining circuits AD1 through AD9 includes three transfer gates TG3, TG4, and TG5. Each of the transfer gates TG3, TG4, and TG5 also comprises a P channel MOS transistor and an N channel MOS transistor connected in parallel. The address signal determining circuits AD1 through AD8 determine, when the replacing operation is to take place, the sets of address signals a4, a5, and a6 for selecting the sub-block selecting signals C0, C1, . . . , and C7, respectively. That is, in each of the circuits AD1 through AD8, the transfer gate TG3 determines the address signal a4; the transfer gate TG4 determines the address signal a5; and the transfer gate TG5 determines the address signal a6, when the replacing operation takes place. To this end, in the address signal determining circuit AD1, all of the inputs of the transfer gates TG3, TG4, and TG5 are connected through resistors R to ground, so that the circuit AD1 sets address signals (a4, a5, a6) to be equal to (0, 0, 0). Also, in the address signal determining circuit AD2, the input of the transfer gate TG3 is connected through a resistor R to a power supply $V_{CC}$, and the other two inputs of the transfer gates TG4 and TG5 are connected through resistors R to ground, so that the circuit AD2 sets the address signals (a4, a5, a6) to be equal to (1, 0, 0). Similarly, in the other address signal determining circuits AD3 through AD8, the inputs of the transfer gates TG3, TG4, and TG5 are connected through resistors R to power supply $V_{CC}$ or to ground in accordance with the desired set of address signals a4, a5, and a6.

In the operation of the circuit shown in FIG. 7, when the replacing operation is not carried out, the reference voltage VRR is at the low level "L" because the virtual word line VWL is not selected (see FIG. 2). The reference voltage VRR is applied to the gates of the P channel MOS transistors of the transfer gates TG1 and to the gates of the N channel MOS transistors of the transfer gates TG2. The inverted reference voltage $\overline{VRR}$ is applied to the gates of the N channel MOS transistors of the transfer gates TG1 and to the gates of the P channel MOS transistors of the transfer gates TG2. Therefore, when the reference voltage VRR is at the low level "L", the transfer gates TG1 are conductive and the transfer gates TG2 are nonconductive. As a result, address input signals A4, A5, and A6 applied from an external source are transferred through the transfer gates TG1 in respective address signal selecting circuits S1, S2, and S3 to the second column decoder 8. That is, the second column decoder 8 receives the external address input signals A4, A5, and A6 as the high order column address signals a4, a5, and a6, respectively.

When the memory cell block 11 is to be replaced by the redundancy memory cell block 19, the control signals BR1 and BR9 are selected at "H" level. The control signal BR1 is applied to the gates of the N channel MOS transistors of the transfer gates TG3, TG4, and TG5 in the first address signal determining circuit AD1. The inverted control signal $\overline{BR1}$ is applied to the gates of the P channel MOS transistors of the transfer gates TG3, TG4, and TG5 in the same circuit AD1. Therefore, the transfer gates TG3, TG4, and TG5 in the circuit AD1 are conductive. The control signal BR9 is applied to the gates of the P channel MOS transistors of the transfer gates TG3, TG4, and TG5 in the ninth address signal determining circuit AD9. The inverted control signal $\overline{BR9}$ is applied to the gates of the N channel MOS transistors of the transfer gates TG3, TG4, and TG5 in the same circuit AD9. Therefore, the transfer gates TG3, TG4, and TG5 in the circuit AD9 are nonconductive. Also, the reference voltage VRR is turned to the high level "H" when the replacing operation is carried out, so that the transfer gates TG1 are nonconductive and the transfer gates TG2 are conductive. As a result, the output of the transfer gate TG3 in the circuit AD1 is transferred through the transfer gate TG3 in the circuit S1 to the second column decoder 8. Since the input of the transfer gate TG3 in the circuit AD1 is grounded through the resistor R, the output thereof is "0", i.e., at the "L" level. Similarly, the outputs of the transfer gates TG4 and TG5 are at the "L" level. Accordingly, the second column decoder 8 receives the address signals a4, a5 and a6 equal to 0, 0, and 0, respectively, regardless of the external address input signals A4, A5, and A6. In response to the address signals 0, 0, and 0, the second column decoder 8 selects the first sub-block selecting signal C0.

Similarly, when the control signal BR2 is selected to be the "H" level, the second column decoder 8 selects the second sub-block selecting signal C1 regardless of the external address input signals A4, A5, and A6.

When the control signal BR3, BR4, . . . , or BR8 is selected, the sub-block selecting signal C3, C4, . . . , or C8 is selected, respectively.

Figure 8:
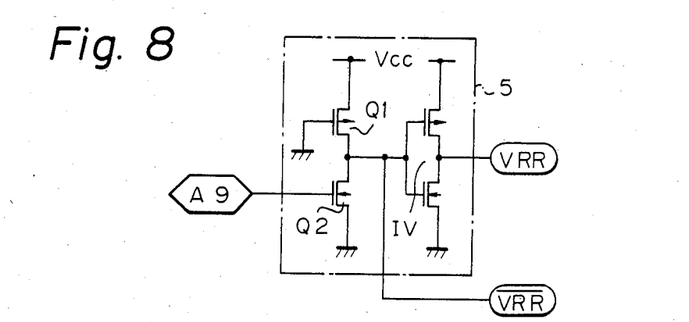
FIG. 8 is a circuit diagram illustrating a signal detecting circuit in the EPROM shown in FIG. 2 in more detail.

FIG. 8 is a detailed circuit diagram of the signal detecting circuit 5. In FIG. 8, the signal detecting circuit 5 includes a P channel MOS transistor Q1, an N channel MOS transistor Q2, and an inverter IV. The gate of the transistor Q1 is grounded. The source of the transistor Q1 is connected to the power supply $V_{CC}$. The drain of the transistor Q1 is connected to the drain of the transistor Q2. The source of the transistor Q2 is grounded. The connecting point between the transistors Q1 and Q2 is connected to the input of the inverter IV. The transistor Q2 has a high threshold voltage slightly lower than 12 V, for example, 10 V. The gate of the transistor Q2 is connected to the address input terminal A9. When the high voltage (12 V) is applied to the address input terminal A9, the transistor Q2 is turned on so that the output of the inverter IV provides the high level "H" of the reference voltage VRR. The inverted reference voltage $\overline{VRR}$ is provided at the input of the inverter IV. The reference voltage VRR is applied to the virtual word line VWL, to the transfer gates in the circuits S1, S2, and S3 (FIG. 7), and to the row decoder circuit 6 (FIG. 2) for inhibiting its operation.

Figure 9:
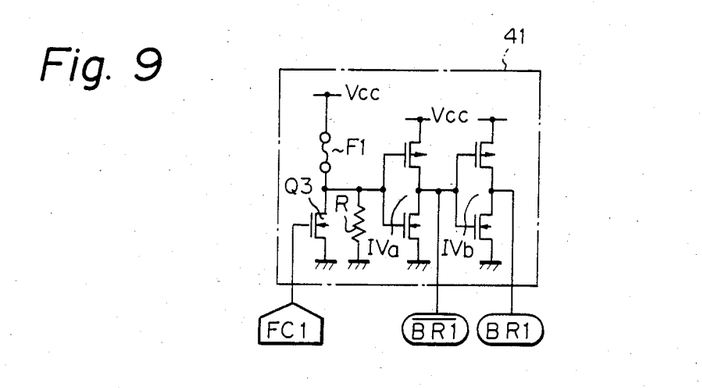
FIG. 9 is a circuit diagram of a control signal generating circuit in the EPROM shown in FIG. 2 in more detail.

FIG. 9 is a circuit diagram of the control signal generating circuit 41. In FIG. 9, the control signal generating circuit 41 includes a fuse F1, an N channel MOS transistor Q3, a resistor R, and two inverters $IV_a$ and $IV_b$. The fuse F1 is connected between the power supply $V_{CC}$ and the drain of the transistor Q3. The source of the transistor Q3 is grounded. The resistor R is connected between the drain of the transistor Q3 and the ground. The drain of the transistor Q3 is connected to the input of the first stage inverter $IV_a$. The output of the first stage inverter $IV_a$ is connected to the input of the second stage inverter $IV_b$. When the fuse blowing signal FC1 is applied to the gate of the transistor Q3, the transistor Q3 turns on so that a current flows and blows the fuse F1. Then the drain of the transistor Q3 is turned to the "L" level. As a result, the control signal $\overline{BR1}$ is obtained at the output of the first stage inverter $IV_a$. Also, the inverted control signal $\overline{BR1}$ is obtained at the output of the second stage inverter $IV_b$. The control signal BR1 and the inverted control signal $\overline{BR1}$ are applied to the transfer gates TG3, TG4, and TG5 in the circuit AD1 (FIG. 7).

The other control signal generating circuits 42 through 49 have the same circuit configurations as that shown in FIG. 9.

Figure 10:
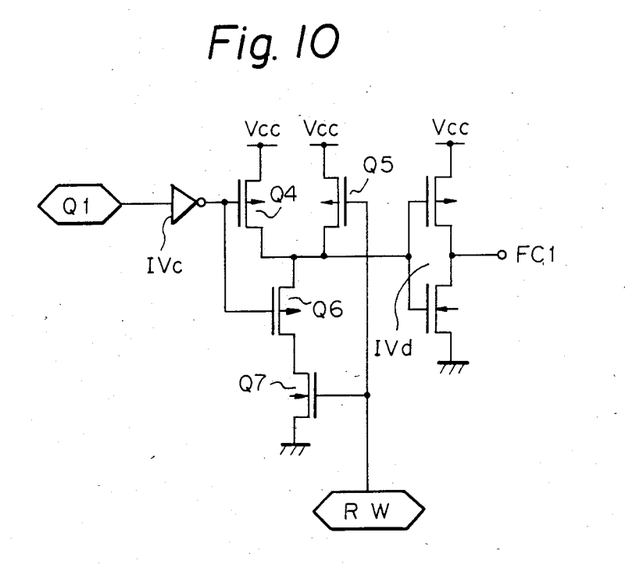
FIG. 10 is a circuit diagram of a circuit for generating a fuse-blowing signal.

FIG. 10 is a circuit diagram of a circuit for generating the fuse-blowing signal FC1. In FIG. 10, the circuit includes an input-stage inverter $IV_c$, three P channel MOS transistors Q4, Q5, and Q6, an N channel MOS transistor Q7, and an output-stage inverter $IV_d$. The output of the inverter $IV_c$ is connected to the gates of the transistors Q4 and Q6. The sources of the transistors Q4 and Q6 are connected to the power supply $V_{CC}$. The drains of the transistors Q4 and Q5 are connected to the source of the transistor Q6 and to the input of the inverter $IV_d$. The drain of the transistor Q6 is connected to the drain of the transistor Q7. The source of the transistor Q7 is grounded.

When the replacing signal RW is at the "L" level, the P channel transistor Q5 is conductive and the N channel transistor Q7 is nonconductive, so that the input of the inverter $IV_d$ is at the "H" level. In this case, the fuse-blowing signal FC1 is at the "L" level so that the fuse F1 (FIG. 9) is blown. When the terminal Q1 is at the "L" level and the replacing signal RW is at the "H" level, the transistors Q4, and Q5, are turned off and the transistors Q6 and Q7 are turned on so that the input of the inverter $IV_d$ is at the "L" level. In this case, the fuse-blowing signal FC1 is at the "H" level so as to blow the fuse F1 (FIG. 9).

The circuits for generating the fuse-blowing signals FC2 through FC8 have the same circuit configurations as the circuit shown in FIG. 10.

As will be apparent, the output terminals Q1 through Q8 are used not only to output read data or to input write data, but also to apply the replaced block selecting signals.

Figure 11:
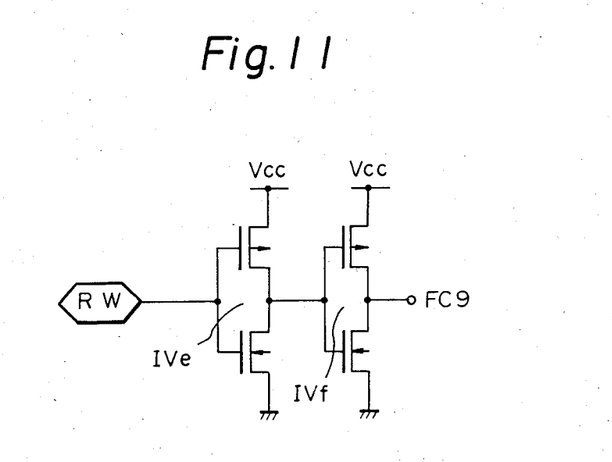
FIG. 11 is a circuit diagram of a circuit for generating a fuse-blowing signal corresponding to the redundancy memory cell block.

FIG. 11 is a circuit diagram of a circuit for generating the fuse-blowing signal FC9 corresponding to the redundancy sub-block. In FIG. 9, the circuit comprises two inverters $IV_e$ and $IV_f$. When the replacing signal RW is at the "H" level, the fuse blowing signal FC9 is turned to the "H" level so as to blow the fuse F9 (not shown).

In the above described embodiment, each of the memory cell blocks 11 through 18 stores eight sets of the same sixteen-bit data D1, D2, ..., or D8. For example, the memory cell block 11 stores, in its specific area 11a, the eight sets of the sixteen-bit data D1, as illustrated in FIG. 3. The present invention, however, is not restricted to the above-described embodiment.

Figure 12:
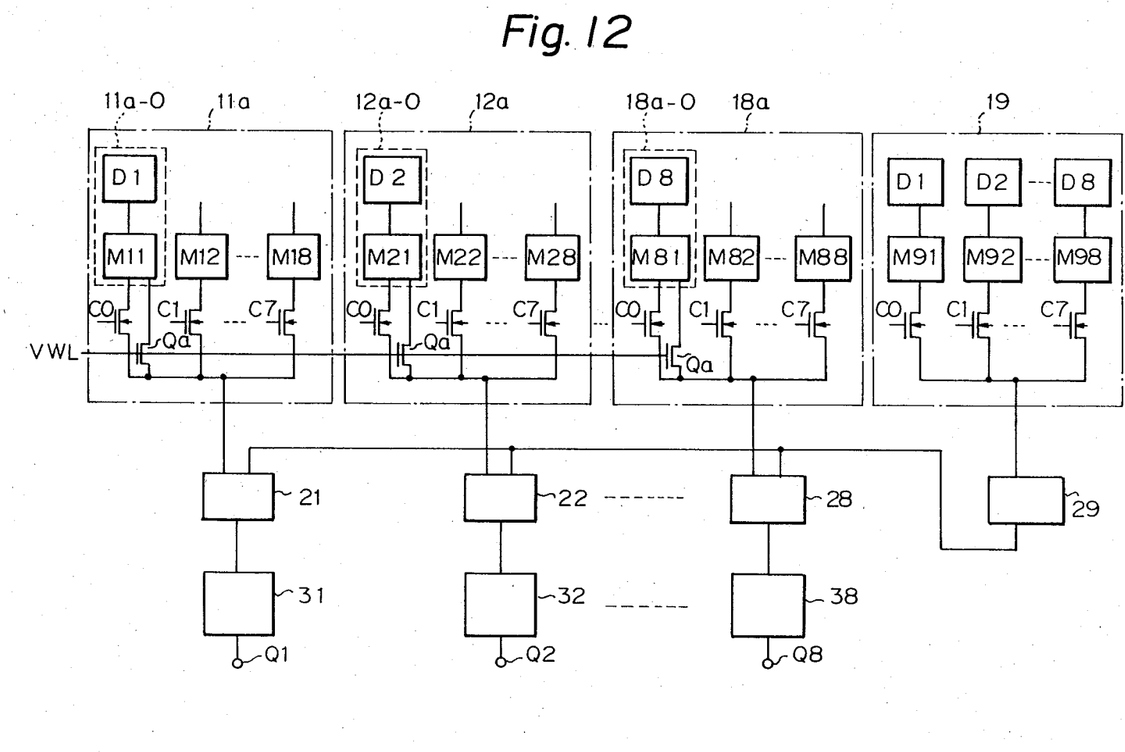
FIG. 12 is a block circuit diagram of an EPROM according to another embodiment of the present invention.

FIG. 12 is a block circuit diagram showing an EPROM according to another embodiment of the present invention. In FIG. 12, the same reference symbols as used in FIG. 3 designate the same parts. The main difference between FIG. 3 and FIG. 12 resides in memory cell blocks 11a, 12a, ..., and 18a. That is, in FIG. 12, each of the memory cell blocks 11a, 12a, ..., and 18a includes, instead of the eight sets, a single set of the sixteen-bit data D1, D2, ..., or D8, in the first sub-block 11a-0, 12a-0, 13a-0, or 18a-0, respectively. The redundancy memory cell block 19 in FIG. 12 is the same as that in FIG. 3.

Also, additional sub-block selecting transistors $Q_a$ are provided, each being connected in parallel to the sub-block selecting transistor $T_{b0}$ in one of the memory cell blocks 11a through 18a. The gates of the additional sub-block selecting transistors $Q_a$ are connected to the virtual word line VWL.

Figure 13:
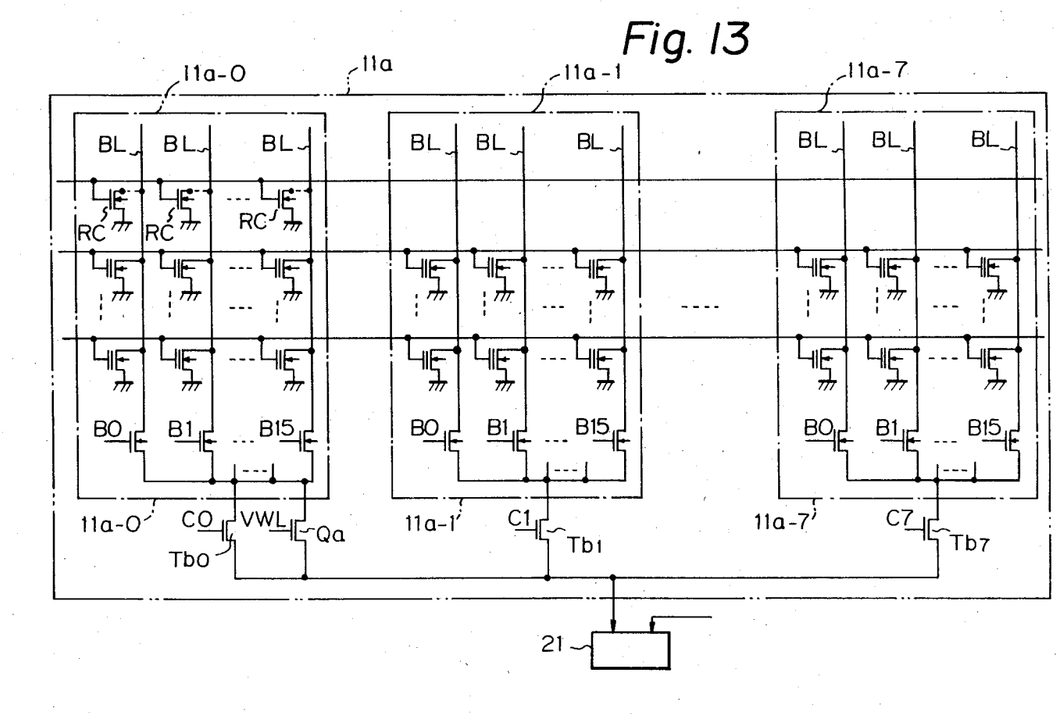
FIG. 13 is a circuit diagram of one memory cell block in the EPROM shown in FIG. 12.

FIG. 13 is a detailed circuit diagram of the memory cell block 11a in the EPROM shown in FIG. 12. In FIG. 13, the read only memory cells RC are provided only in the first sub-block 11a-0. Also, the additional sub-block selecting transistor $Q_a$ is connected in parallel to the transistor $T_{b0}$.

In the circuit in FIGS. 12 and 13, when the redundancy memory cell block 19 is not used during the reading of the electronic signature, the virtual word line VWL is to be the "H" level so that the data D1, D2, ..., and D8 are read from the sub-blocks 11a-0, 12a-0, ..., and 18a-0, respectively. When the redundancy memory cell block 19 is used during the reading of the electronic signature, the circuit shown in FIG. 7 is also used in the same way as in the before-described embodiment.

From the foregoing description, it will be apparent that, according to the present invention, in a semiconductor memory device having a redundancy circuit an electronic signature reading circuit can be provided which can correctly read an electronic signature even when a memory cell block corresponding to any output bit is replaced by a redundancy memory cell block.

The present invention is not restricted to the described embodiments. Various changes and modifications are possible without departing from the spirit of the invention. For example, the memory size is arbitrarily chosen. Also, the present invention is applicable not only for an EPROM, but also for a PROM or a random access memory (RAM).

We claim:
1. A semiconductor memory device comprising:
a plurality of output terminals for respectively outputting a plurality of output bit data;
a plurality of memory cell blocks, respectively, operatively connected to said output terminals and each having a first specific area for storing first predetermined data and each having a first memory data area for storing first data;
a redundancy memory cell block, operatively connected to said plurality of memory cells, for replac- ing a faulty memory cell block among said plurality of memory cell blocks, having a second specific area for storing second predetermined data comprising a plurality of bits, and having a second memory data area for storing second data, said first predetermined data being equal to a divided one of said second predetermined data in a one to one correspondence, said second specific area in said redundancy memory cell block being divided into a plurality of sub-blocks, each of said sub-blocks storing a divided one of said second predetermined data, and each of said second sub-blocks corresponding to one of said plurality of memory cell blocks; and means, operatively connected to said plurality of memory cell blocks, for selectively reading, when said first memory data area in one of said memory cell blocks is replaced by said second memory data areas in said redundancy memory cell block, a divided one of said second predetermined data corresponding to said first predetermined data stored in said one of said memory cell blocks to be replaced by said redundancy memory cell block.

2. A semiconductor memory device as set forth in claim 1, wherein said first specific area in each of said plurality of memory cell blocks is divided into a plurality of first sub-blocks, at least one of said first sub-blocks in each of said plurality of memory cell blocks storing the same data as that stored in one of said second sub-blocks.

3. A semiconductor memory device as set forth in claim 2, wherein each of said first sub-blocks in each of said plurality of memory cell blocks stores the same data as that stored in one of said second sub-blocks.

4. A semiconductor memory device as set forth in claim 2 or 3, wherein said means comprises an address signal generating circuit for selecting one of said second sub-blocks, said selected second sub-block corresponding to one of said plurality of memory cell blocks to be replaced by said redundancy memory cell block.

5. A semiconductor memory device as set forth in claim 4, wherein said means further comprises a plurality of switching circuits, respectively, operatively connected to said memory cell blocks, for selecting, when said selected second sub-block is to be replaced by said redundancy memory cell block, the output of said redundancy memory cell block in place of the output of said selected second sub-block and transferring the output to said respective output terminal.

6. A semiconductor memory device as set forth in claim 5, wherein said means further comprises a plurality of control signal generating circuits, respectively, operatively connected to said switching circuits and operatively connected to said redundancy memory cell block, for generating, when said selected second sub-block is to be replaced, a control signal for controlling the switching operation of the respective switching cirtuit.

7. A semiconductor memory device as set forth in claim 6, operatively connected to receive a specific address input signal, wherein said semiconductor memory device further comprises a virtual word line, wherein said first specific area and said second specific area comprise read only memory cells, operatively connected to said virtual word line, for storing said first and second predetermined data, and for being selected by said virtual word line, and wherein said means further comprises a signal detecting circuit, operatively connected to said virtual word line, for selecting said virtual word line in response to the specific address input signal and for reading said first or second predetermined data.

8. A semiconductor memory device as set forth in claim 7, wherein said address signal generating circuit comprises:

a plurality of address signal determining circuits, respectively, operatively connected to said memory cell blocks, for determining, in response to said control signal and when said selected second sub-block is to be replaced by said redundancy memory cell block, fixed address signals for accessing said selected second sub-block corresponding to one of said memory cell blocks to be replaced; and a plurality of address signals selecting circuits, operatively connected to receive said specific address input signal, each of said plurality of address signal selecting circuits selecting an external address input signal or one of said fixed address signals in response to said specific address input signal.

9. A semiconductor memory device as set forth in claim 8, further comprising word lines and bit lines intersecting said word lines, wherein said memory cell blocks include erasable and programmable read only memory cells in said second specific area, and wherein said redundancy memory cell blocks include redundancy memory cells in said first specific area, each of said erasable and programmable read only memory cells and said redundancy memory cells being arranged between the intersections of said word lines and said bit lines.

10. A semiconductor memory device as set forth in claim 9, further comprising a row decoder, operatively connected to said word lines and said virtual word line, for selecting one of said word lines, said row decoder being inhibited to select said word lines when said virtual word line is selected.

11. A semiconductor memory device as set forth in claim 10, wherein said means further comprises a signal detecting circuit, operatively connected to said virtual word line, for detecting said specific address input signal so as to select said virtual word line, inhibit the operation of said row decoder and activate said address signal selecting circuits to select said fixed address signals.

* * * * *